(12) United States Patent
Shinkawata

(10) Patent No.: US 8,058,679 B2
(45) Date of Patent: Nov. 15, 2011

(54) SEMICONDUCTOR DEVICE AND SEMICONDUCTOR DEVICE MANUFACTURING METHOD

(75) Inventor: Hiroki Shinkawata, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/025,858

(22) Filed: Feb. 11, 2011

(65) Prior Publication Data

US 2011/0133293 A1    Jun. 9, 2011

Related U.S. Application Data

(60) Continuation of application No. 12/000,236, filed on Dec. 11, 2007, now Pat. No. 7,919,799, which is a continuation of application No. 11/448,712, filed on Jun. 8, 2006, now Pat. No. 7,329,575, which is a division of application No. 10/766,013, filed on Jan. 29, 2004, now Pat. No. 7,078,758.

(30) Foreign Application Priority Data

Feb. 21, 2003   (JP) ................................ 2003-044155
Oct. 3, 2003    (JP) ................................ 2003-345633

(51) Int. Cl.
    *H01L 27/108*       (2006.01)
(52) U.S. Cl. ........................................ 257/296; 257/300
(58) Field of Classification Search .................. 257/296, 257/300, 306, 309, 298, E21.648, E21.649; 438/241, 381, 383, 592
    See application file for complete search history.

(56) References Cited

U.S. PATENT DOCUMENTS

| 5,858,831 | A  | 1/1999  | Sung |
| 6,140,174 | A  | 10/2000 | Kwon et al. |
| 6,281,540 | B1 | 8/2001  | Aoki |
| 6,448,618 | B1 | 9/2002  | Inaba et al. |
| 6,815,281 | B1 | 11/2004 | Inoue et al. |
| 7,586,141 | B2 | 9/2009  | Shinkawata |

FOREIGN PATENT DOCUMENTS

| JP | 8-31769    | 2/1996 |
| JP | 10-242420  | 9/1998 |
| JP | 10-242422  | 9/1998 |

(Continued)

OTHER PUBLICATIONS

Japanese Office Action dated Dec. 21, 2010 in Japanese Patent Application No. 2003-345633 (with English Translation) 6 pages.

*Primary Examiner* — David Vu

(74) *Attorney, Agent, or Firm* — Oblon, Spivak, McClelland, Maier & Neustadt, L.L.P.

(57) ABSTRACT

A semiconductor device including a semiconductor substrate having a logic formation region where a logic device is formed; a first impurity region formed in an upper surface of the semiconductor substrate in the logic formation region; a second impurity region formed in an upper surface of the semiconductor substrate in the logic formation region; a third impurity region formed in an upper surface of the first impurity region and having a conductivity type different from that of the second impurity region; a fourth region formed in an upper surface of the second impurity region and having a conductivity type different from that of the second impurity region; a first silicide film formed in an upper surface of the third impurity region; a second silicide film formed in an upper surface of the fourth impurity region and having a larger thickness than the first silicide film.

5 Claims, 17 Drawing Sheets

FOREIGN PATENT DOCUMENTS

| | | |
|---|---|---|
| JP | 11-17129 | 1/1999 |
| JP | 2000-40806 | 2/2000 |
| JP | 2000-243926 | 9/2000 |
| JP | 2000-269482 | 9/2000 |
| JP | 2001-127270 | 5/2001 |
| JP | 2002-270795 | 9/2002 |
| JP | 2003142608 A | 5/2003 |
| WO | WO 98/42009 | 9/1998 |

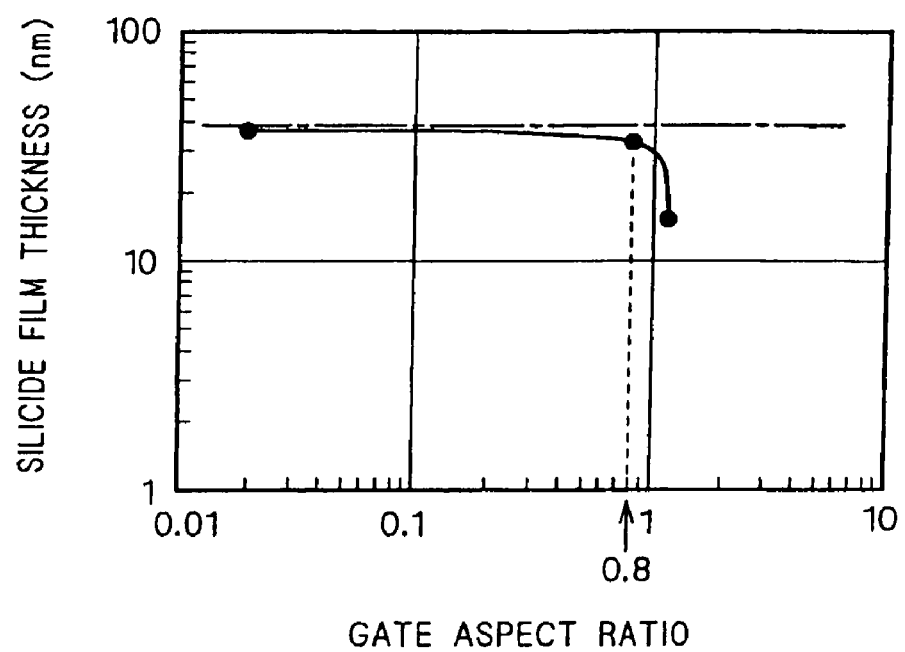
F I G . 8

SEMICONDUCTOR DEVICE AND SEMICONDUCTOR DEVICE MANUFACTURING METHOD

CROSS-REFERENCE TO RELATED APPLICATIONS

This application is a continuation of application Ser. No. 12/000,236 filed Dec. 11, 2007 which is a continuation of application Ser. No. 11/448,712 filed Jun. 8, 2006, (now U.S. Pat. No. 7,329,575) which is a division of prior application Ser. No. 10/766,013 filed Jan. 29, 2004, (now U.S. Pat. No. 7,078,758) each of which are incorporated in their entirety by reference. Foreign priority is also claimed to Japanese Application Numbers 2003-044155 filed Feb. 21, 2003 and 2003-345633 filed Oct. 3, 2003.

BACKGROUND OF THE INVENTION

1. Field of the Invention

The present invention relates to a memory/logic mixed semiconductor device in which memory and logic devices are fabricated on a semiconductor substrate, and to a method for manufacturing the same.

2. Description of the Background Art

In the field of recent system LSIs, memory/logic mixed semiconductor devices are attracting attention in which large-capacity high-speed memory devices and logic devices are constructed on the same semiconductor substrate. Among them, as to semiconductor devices mounted with DRAMs suitable for large capacity applications, devices in which silicide films are formed within memory cells are developed to achieve higher speed memory devices.

Japanese Patent Application Laid-Open No. 2001-127270 (hereinafter referred to as a first patent document) discloses an example of such a memory/logic mixed semiconductor device having silicide films within memory cells. According to the technique described in the first patent document, silicide films are formed on source/drain regions and gate electrodes of transistors in both of a DRAM portion where DRAM resides and a logic portion where a logic device resides. Techniques about formation of silicide films are disclosed in Japanese Patent Application Laid-Open Nos. 2000-269482 and 8-31769 (1996) and International Publication WO98/42009.

In the memory/logic mixed semiconductor device described in the first patent document, as shown in FIG. 6 attached to it, the silicide film in the upper surfaces of source/drain regions in the DRAM portion and the silicide film in the upper surfaces of source/drain regions in the logic portion have the same thickness. Therefore, when the silicide film in the logic portion is formed thick to achieve higher speed of the logic device, then the silicide film in the DRAM portion, too, forms thick, which increases the leakage current of capacitors electrically connected to the source/drain regions. This deteriorates data storage characteristic of the DRAM. On the other hand, when the silicide film in the DRAM portion is formed thin to reduce the capacitor leakage current, then the silicide film in the logic portion also forms thin, which lowers operating speed of the logic device.

SUMMARY OF THE INVENTION

An object of the present invention is to provide a semiconductor technique that can achieve both of lowered resistance in a region where a logic device is formed and reduced leakage current of the capacitor of a memory device.

According to a first aspect of the invention, a semiconductor device includes a semiconductor substrate, first to fourth impurity regions, first and second silicide films, and a capacitor. The semiconductor substrate has a memory formation region in which a memory device is formed and a logic formation region in which a logic device is formed. The first impurity region is formed in an upper surface of the semiconductor substrate in the memory formation region. The second impurity region is formed in the upper surface of the semiconductor substrate in the logic formation region. The third impurity region is formed in an upper surface of the first impurity region and has a conductivity type different from that of the first impurity region. The fourth impurity region is formed in an upper surface of the second impurity region and has a conductivity type different from that of the second impurity region. The first silicide film is formed in an upper surface of the third impurity region. The capacitor is formed above the first silicide film and electrically connected to the first silicide film. The second silicide film is formed in an upper surface of the fourth impurity region and is thicker than the first silicide film.

The first silicide film in the memory formation region is thinner than the second silicide film in the logic formation region, so that the leakage current between the first and third impurity regions is lower than the leakage current between the second and fourth impurity regions. On the other hand, since the second silicide film is thicker than the first silicide film, the resistance of the fourth impurity region is lower than that of the third impurity region. Thus it is possible to achieve both of lowered resistance of the fourth impurity region in the logic formation region and reduced leakage current of the capacitor electrically connected to the first silicide film.

According to a second aspect of the invention, a semiconductor device manufacturing method includes the following steps (a) to (g). The step (a) is to prepare a semiconductor substrate having a memory formation region where a memory device is to be formed and a logic formation region where a logic device is to be formed. The step (b) is to form first and second impurity regions in an upper surface of the semiconductor substrate in the memory formation region and the logic formation region, respectively. The step (c) is to form first and second gate structures spaced apart at a given distance from each other on the upper surface of the semiconductor substrate in the memory formation region, and to form a third impurity region in an upper surface of the first impurity region between the first and second gate structures, the third impurity region having a conductivity type different from that of the first impurity region. The step (d) is to form third and fourth gate structures spaced apart at a given distance from each other on the upper surface of the semiconductor substrate in the logic formation region, and to form a fourth impurity region in an upper surface of the second impurity region between the third and fourth gate structures, the fourth impurity region having a different conductivity type from the second impurity region. The step (e) is to apply a nondirectional sputtering method from above the structure obtained by the steps (c) and (d) to deposit a metal material on the third impurity region between the first and second gate structures and on the fourth impurity region between the third and fourth gate structures. The step (f) is to cause the metal material and the semiconductor substrate to react with each other to form silicide films in the upper surfaces of the third and fourth impurity regions. The step (g) is to form a capacitor above the silicide film in the upper surface of the third impurity region, the capacitor being electrically connected to the silicide film in the upper surface of the third impurity region. A first gate aspect ratio defined by the distance between the first and second gate structures and a height of the first and second gate structures is larger than a second gate aspect ratio defined by the distance between the third and fourth gate structures and a height of the third and fourth gate structures.

Since the first gate aspect ratio is larger than the second gate aspect ratio, the use of the nondirectional sputtering method in step (e) causes the metal material to form thinner on the third impurity region than on the fourth impurity region. This causes in step (f) the silicide film to form thinner in the upper surface of the third impurity region than in the upper surface of the fourth impurity region. This makes the leakage current between the first and third impurity regions lower than the leakage current between the second and fourth impurity regions. On the other hand, since the silicide film in the upper surface of the fourth impurity region is thicker than the silicide film in the upper surface of the third impurity region, the fourth impurity region presents a lower resistance than the third impurity region. Thus it is possible to achieve both of lowered resistance of the fourth impurity region in the logic formation region and reduced leakage current of the capacitor electrically connected to the first silicide film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing a relation between gate aspect ratio and silicide film thickness;

DESCRIPTION OF THE PREFERRED EMBODIMENTS

First Preferred Embodiment

Figure 1:
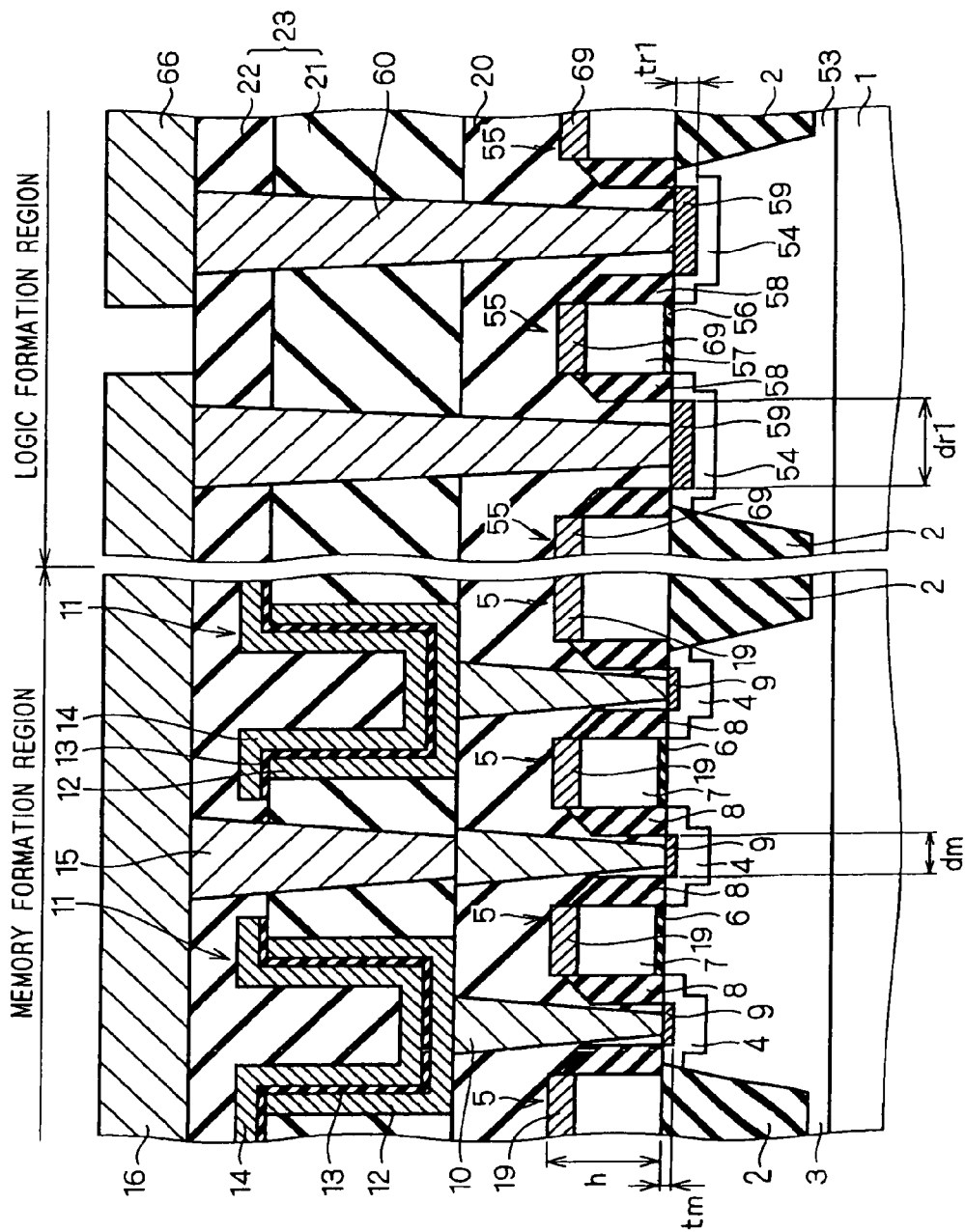
FIG. 1 is a cross-sectional view showing the structure of a semiconductor device according to a first preferred embodiment of the invention.

FIG. 1 is a cross-sectional view showing the structure of a semiconductor device according to a first preferred embodiment of the invention. The semiconductor device of the first preferred embodiment is a memory/logic mixed semiconductor device, where DRAM having CUB (Capacitor Under Bit line) structure memory cells is adopted as the memory device and Dual-Gate salicide CMOS transistors are adopted as the logic device, for example.

As shown in FIG. 1, the semiconductor device of the first preferred embodiment has a semiconductor substrate 1 that is, for example, an n-type silicon substrate. Element isolation insulating films 2 are formed in the upper surface of the semiconductor substrate 1 to divide the semiconductor substrate 1 into a plurality of regions.

In a region where the memory device is formed (hereinafter referred to as a "memory formation region"), a p-type well region 3 is formed in the upper surface of the semiconductor substrate 1. In a region where the logic device is formed (hereinafter referred to as a "logic formation region"), a p-type well region 53 is formed in the upper surface of the semiconductor substrate 1.

In the upper surface of the well region 3, a plurality of source/drain regions 4 are formed at given distances from each other, with cobalt silicide films 9 formed in their upper surfaces. In the upper surface of the well region 53, a plurality of source/drain regions 54 are formed at given distances from each other, with cobalt silicide films 59 formed in their upper surfaces. The source/drain regions 4 and 54 are both n-type impurity regions.

In the memory formation region, a plurality of gate structures 5 are located at given distances on the semiconductor substrate 1. Each gate structure 5 is formed of a gate insulating film 6, a gate electrode 7 serving as a word line of DRAM memory cells, and sidewalls 8, with a cobalt silicide film 19 formed on top of the gate electrode 7. The gate insulating film 6, gate electrode 7 and cobalt silicide film 19 are stacked in this order on the semiconductor substrate 1, forming a stacked structure. The sidewalls 8 are formed on the sides of the stacked structure. Each gate structure 5 is positioned on the upper surface of the semiconductor substrate 1 between adjacent source/drain regions 4, with the cobalt silicide films 9 between adjacent gate structures 5.

In the logic formation region, a plurality of gate structures 55 are located at given distances on the semiconductor substrate 1. Each gate structure 55 is formed of a gate insulating film 56, a gate electrode 57, and sidewalls 58, with a cobalt silicide film 69 formed on top of the gate electrode 57. The gate insulating film 56, gate electrode 57 and cobalt silicide film 69 are stacked in this order above the semiconductor substrate 1, forming a stacked structure. The sidewalls 58 are formed on the sides of the stacked structure. Each gate structure 55 is positioned on the upper surface of the semiconductor substrate 1 between adjacent source/drain regions 54, with the cobalt silicide films 59 between adjacent gate structures 55.

A gate structure 5, a pair of adjacent source/drain regions 4, and the well region 3 form an MOS transistor in a DRAM memory cell, and a gate structure 55, a pair of adjacent source/drain regions 54, and the well region 53 form an MOS transistor that functions as the logic device. The gate insulating films 6 and 56 are made of a film of silicon oxide and the gate electrodes 7 and 57 are made of a film of polycrystalline silicon, for example.

The cobalt silicide films 9 in the memory formation region are thinner than the cobalt silicide films 59 in the logic formation region. Thus the film thickness "tm" of the cobalt silicide films 9 is smaller than the film thickness "tr1" of the cobalt silicide films 59.

The gate structures 5 and 55 have the same height, "h," and the distance "dm" between adjacent gate structures 5 is smaller than the distance "dr1" between adjacent gate structures 55. Therefore the gate aspect ratio in the memory formation region is larger than the gate aspect ratio in the logic formation region.

Now, the gate aspect ratio is the ratio between the gate structure height and the distance between adjacent gate structures. More specifically, the gate aspect ratio in the memory formation region is obtained by dividing the height "h" of the gate structure 5 by the distance "dm" between adjacent gate structures 5. The gate aspect ratio in the logic formation region is obtained by dividing the height "h" of the gate structure 55 by the distance "dr1" between adjacent gate structures 55. Hereinafter, the value obtained by dividing the height "h" of the gate structure 5 by the distance "dm" between gate structures 5 is referred to as a first gate aspect ratio and the value obtained by dividing the height "h" of the gate structure 55 by the distance "dr1" between gate structures 55 is referred to as a second gate aspect ratio.

In the first preferred embodiment, the first gate aspect ratio is set larger than 0.8 and the second gate aspect ratio is set equal to or less than 0.8.

An interlayer insulating film 20 is formed over the semiconductor substrate 1 in the memory formation region and logic formation region, covering the gate structures 5 and 55 and cobalt silicide films 19 and 69. A plurality of contact plugs 10 are formed in the interlayer insulating film 20 and connected to the cobalt silicide films 9. The source/drain regions 4 and the contact plugs 10 are thus electrically connected to each other. The upper surfaces of the contact plugs 10 are exposed from the interlayer insulating film 20.

An insulating layer 23, including interlayer insulating films 21 and 22, is formed over the interlayer insulating film 20 and contact plugs 10. A plurality of DRAM memory cell capacitors 11 are formed in the insulating layer 23; each capacitor 11 has a lower electrode 12, a dielectric film 13, and an upper electrode 14. Each upper electrode 14 is positioned opposite to the lower electrode 12 with the dielectric film 13 between them.

The lower electrodes 12 of capacitors 11 are connected to some of the plurality of contact plugs 10, specifically to contact plugs 10 that are each electrically connected to one of adjacent source/drain regions 4. The cobalt silicide film 9 in that one of adjacent source/drain regions 4 and the capacitor 11 are thus electrically connected to each other.

A plurality of contact plugs 15 are formed in the insulating layer 23. The contact plugs 15 are connected to contact plugs 10 that are not electrically connected to capacitors 11. Also, a plurality of contact plugs 60 are formed in the interlayer insulating film 20 and insulating layer 23. The contact plugs 60 are connected to the cobalt silicide films 59 in the source/drain regions 54. The top surfaces of the contact plugs 15 and 60 are exposed from the insulating layer 23.

On the insulating layer 23, metal interconnection 16 lies in contact with the contact plugs 15 and metal interconnection 66 lies in contact with the contact plugs 60. The metal interconnection 16 is a DRAM memory cell bit line which is located above the capacitors 11.

In this way, in the semiconductor device of the first preferred embodiment, the cobalt silicide films 9 in the upper surfaces of the source/drain regions 4 are thinner than the cobalt silicide films 59 in the upper surfaces of the source/drain regions 54. Therefore the distances between the cobalt silicide films 9 and the well region 3 are longer than the distances between the cobalt silicide films 59 and the well region 53. Therefore the leakage current between the source/drain regions 4 and the well region 3 is lower than the leakage current between the source/drain regions 54 and the well region 53.

On the other hand, since the cobalt silicide films 59 are thicker than the cobalt silicide films 9, the source/drain regions 54 exhibit a lower resistance than the source/drain regions 4. It is thus possible to achieve both of a reduction in resistance of the source/drain regions 54 in the logic formation region and a reduction in leakage current of the capacitors 11 electrically connected to the cobalt silicide films 9.

Furthermore, the presence of cobalt silicide films 59 in the source/drain regions 54 enables high speed operation of MOS transistors in the logic formation region.

Next, a method for manufacturing the semiconductor device of FIG. 1 is described.

Figure 2:
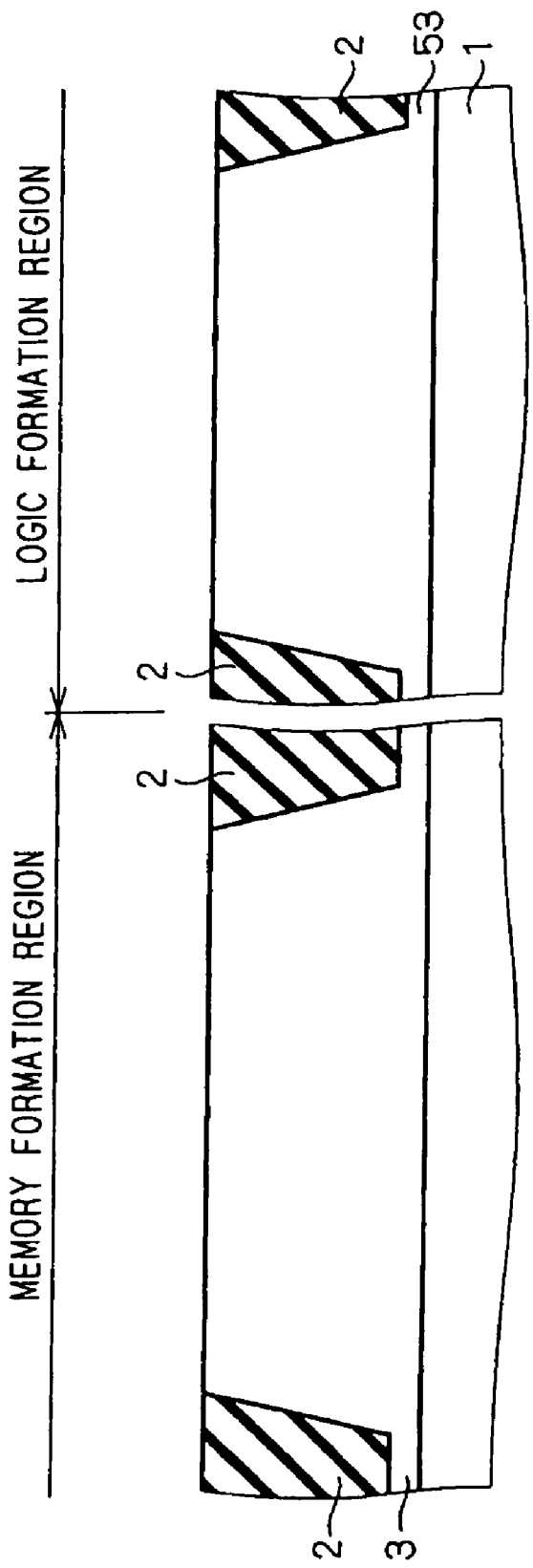
FIGS. 2 to 7 are cross-sectional views showing a sequence of process steps for manufacturing the semiconductor device of the first preferred embodiment of the invention.

FIGS. 2 to 7 are cross-sectional views showing a sequence of process steps for manufacturing the semiconductor device of FIG. 1. First, as shown in FIG. 2, element isolation insulating films 2 are formed in the upper surface of the semiconductor substrate 1 by a known LOCOS isolation technique or trench isolation technique. Then, well regions 3 and 53 are formed in the upper surface of the semiconductor substrate 1 in the memory formation region and logic formation region, respectively.

Figure 3:
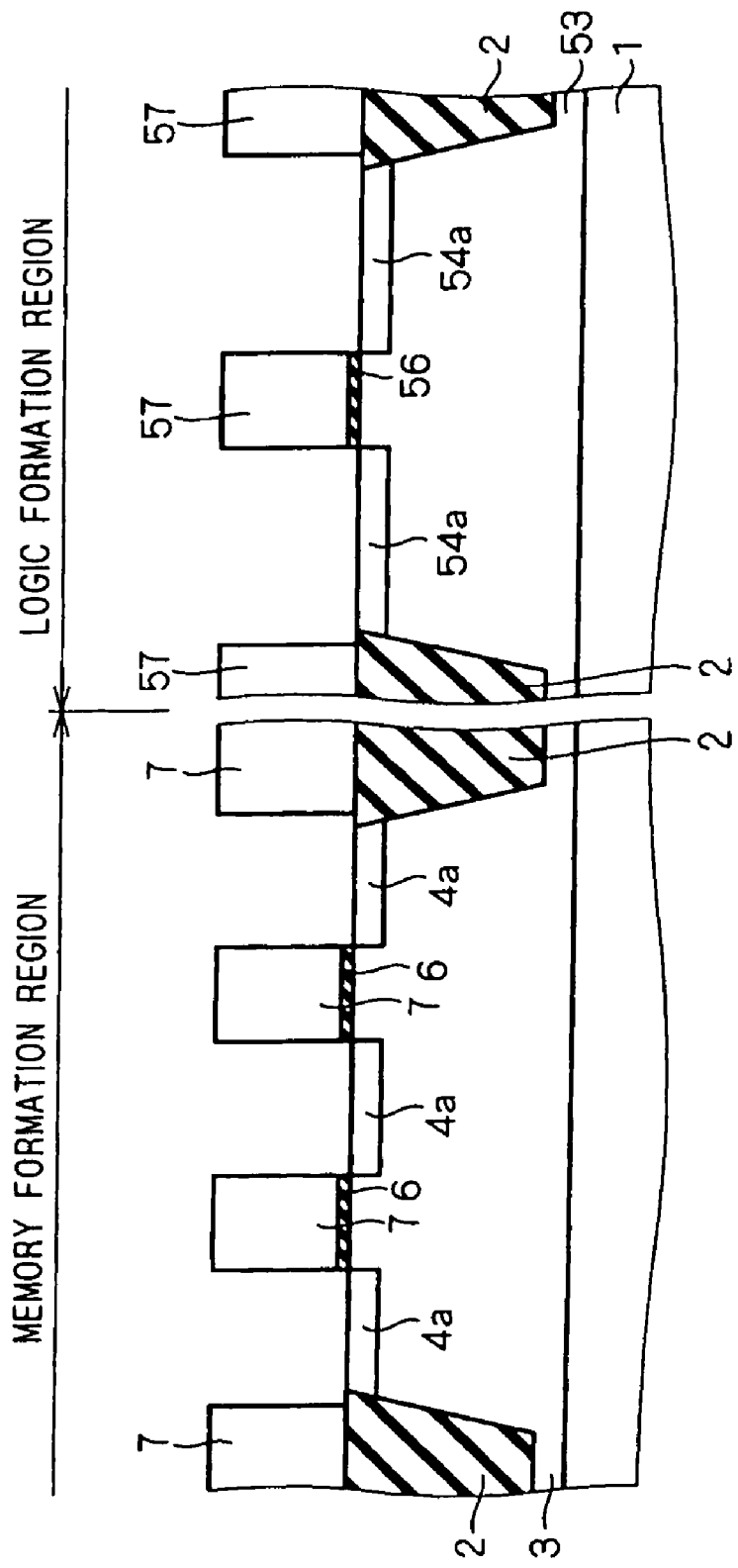

Next, by thermally oxidizing the semiconductor substrate 1, for example, a silicon oxide film is formed on the upper surface of the semiconductor substrate 1, and then a polycrystalline silicon film is formed all over the surface. Then, the silicon oxide film and polycrystalline silicon film are etched using a resist having a given opening pattern. Thus, as shown in FIG. 3, the gate insulating films 6 and gate electrodes 7 are formed in the memory formation region and the gate insulating films 56 and gate electrodes 57 are formed in the logic formation region.

Next, using the element isolation insulating films 2, gate insulating films 6, 56, and gate electrodes 7, 57 as masks, an impurity, e.g. phosphorus or arsenic, is ion-implanted at a relatively low concentration into the upper surface of the semiconductor substrate 1. Thus, as shown in FIG. 3, $n^-$-type impurity regions 4a are formed in the upper surface of the semiconductor substrate 1 in the memory formation region, and $n^-$-type impurity regions 54a are formed in the upper surface of the semiconductor substrate 1 in the logic formation region.

Next, a silicon nitride film is formed by, e.g. CVD, all over the surface, and then etched by an anisotropic dry etching process presenting a high etch rate in the depth direction of the semiconductor substrate 1. This forms, as shown in FIG. 4, sidewalls 8 and 58, both of which are of silicon nitride film, whereby the gate structures 5 and 55 are completed on the semiconductor substrate 1.

Next, using the gate structures 5 and 55 and the element isolation insulating films 2 as masks, an impurity, e.g. phosphorus or arsenic, is ion-implanted into the upper surface of the semiconductor substrate 1 at a relatively high concentration. Thus, as shown in FIG. 4, $n^+$-type impurity regions 4b are formed in the upper surface of the semiconductor substrate 1 in the memory formation region, and $n^+$-type impurity regions 54b are formed in the upper surface of the semiconductor substrate 1 in the logic formation region.

Figure 4:
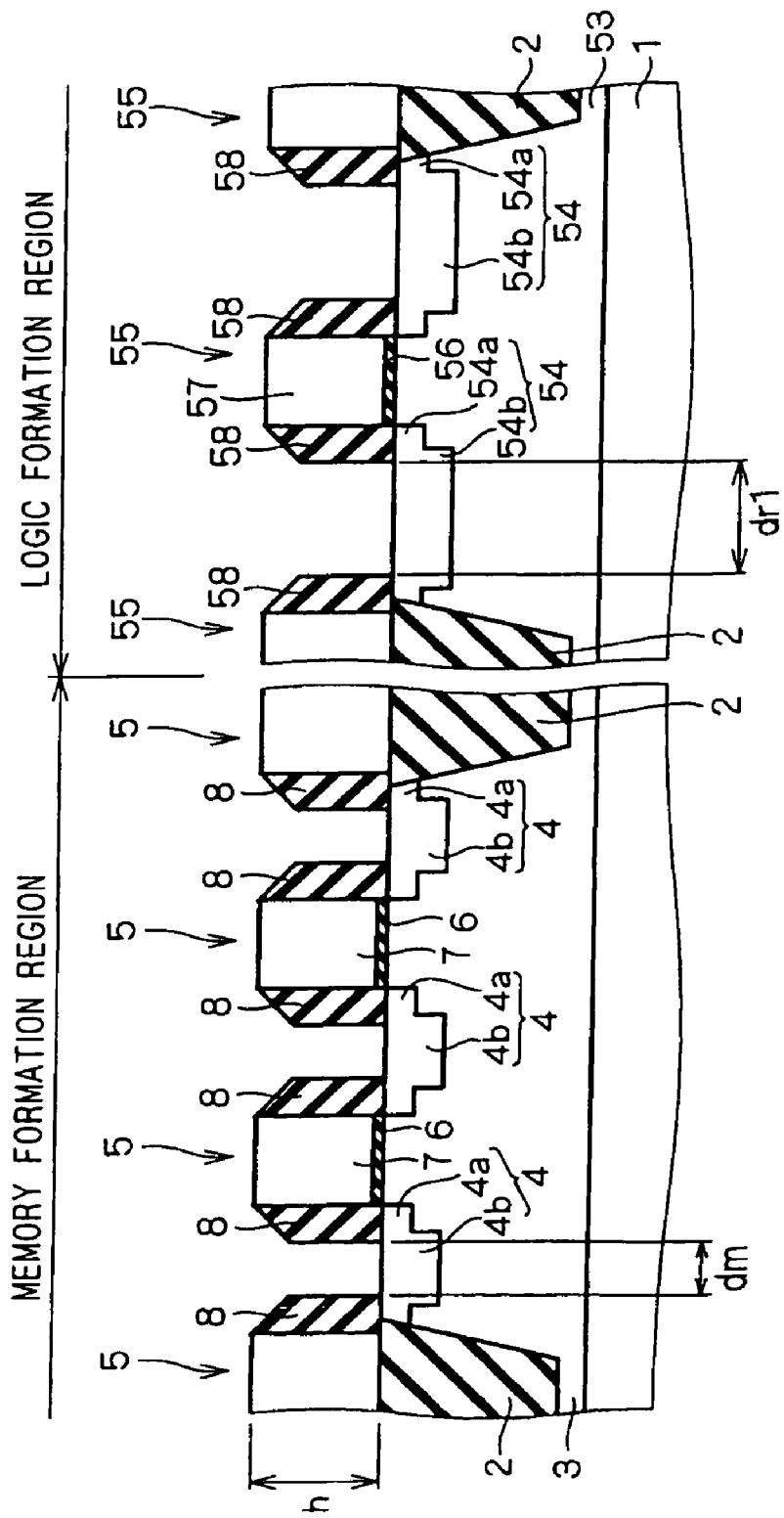

Through the process steps described referring to FIGS. 3 and 4, a plurality of gate structures 5 are formed on the semiconductor substrate 1 in the memory formation region, and source/drain regions 4, including impurity regions 4a and 4b, are formed in the upper surface of the well region 3 between adjacent gate structures 5, whereby MOS transistors in DRAM memory cells are completed. Also, in the logic formation region, a plurality of gate structures 55 are formed on the semiconductor substrate 1 and source/drain regions 54 including impurity regions 54a, 54b are formed in the upper surface of the well region 53 between adjacent gate structures 55, whereby MOS transistors serving as the logic device are completed.

Figure 5:
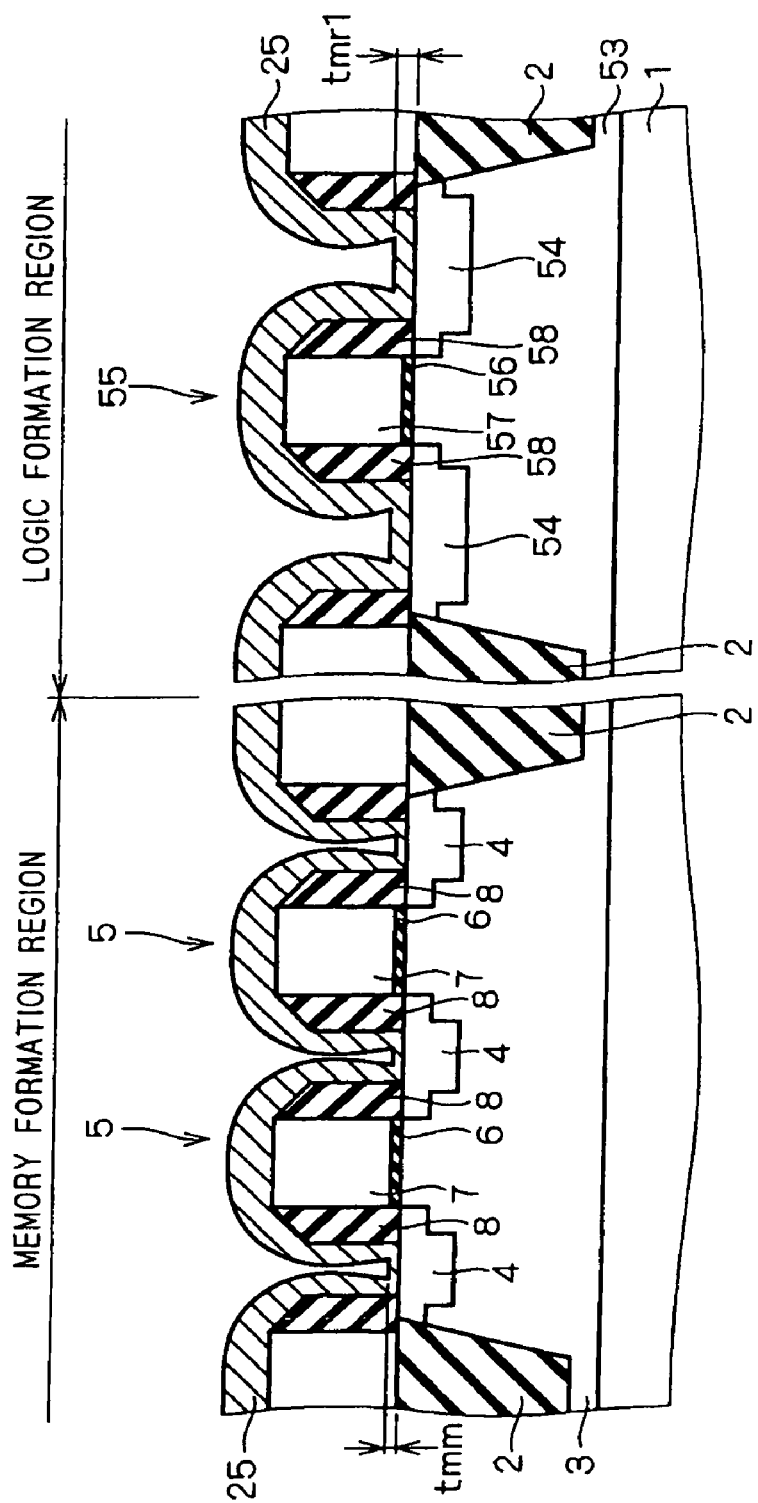

Next, as shown in FIG. 5, a metal material 25 of cobalt is deposited all over the surface from above the structure shown in FIG. 4 by using a nondirectional sputtering method. Now, unlike a sputtering method with good linearity, such as collimation sputtering method, the nondirectional sputtering method uses no special means to restrict directions of the metal material sputtered off the target to the depth direction of the semiconductor substrate. Therefore, the nondirectional sputtering method allows the metal material sputtered off the target to be deposited on the semiconductor substrate with vectors in all directions.

When metal material is thus deposited by such a nondirectional sputtering method from above the semiconductor substrate having a plurality of gate structures at given intervals, then the film thickness of the metal material deposited on the source/drain regions between adjacent gate structures depends on the gate aspect ratio. As previously stated, the nondirectional sputtering method allows the metal material to scatter with vectors in all directions. Accordingly, with a larger aspect ratio, a thicker film of metal material is deposited on sides of the gate structures, while a thinner film of metal material is deposited on the source/drain regions.

In the first preferred embodiment, the first gate aspect ratio defined by the height of the gate structures 5 in the memory formation region and the distance between gate structures 5 is set larger than the second gate aspect ratio defined by the height of the gate structures 55 in the logic formation region and the distance between gate structures 55. Therefore, when metal material 25 is deposited all over the surface by using the nondirectional sputtering method, as shown in FIG. 5, the thickness "tmm" of the metal material 25 on the source/drain regions 4 is smaller than the thickness "tmr1" of the metal material 25 on the source/drain regions 54.

Next, a thermal process with a lamp annealing apparatus, for example, is performed to cause the metal material 25 and the silicon in contact with it to react with each other. That is, a reaction is caused between the metal material 25 and the semiconductor substrate 1 and gate electrodes 7 and 57 that are in contact with it. Then unreacted portion of the metal material 25 is removed.

Figure 6:
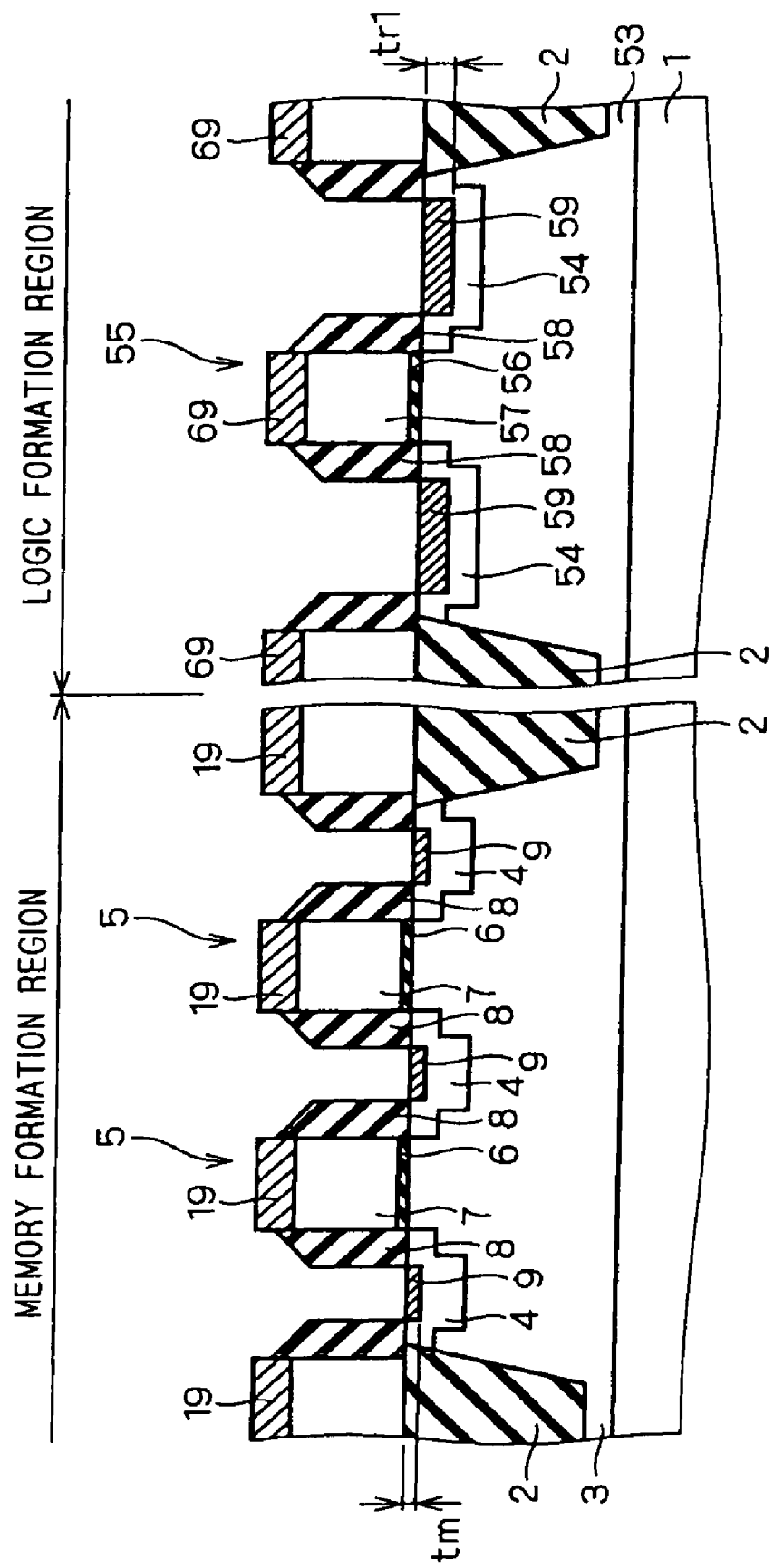

Thus, as shown in FIG. 6, the upper surface of the semiconductor substrate 1 is partially silicidized to form cobalt silicide films 9 and 59 in the upper surfaces of the source/drain regions 4 and 54, respectively. At the same time, the top surfaces of the gate electrodes 7 and 57 are silicidized to form cobalt silicide films 19 and 69 on the gate electrodes 7 and 57, respectively.

During this process, because the film thickness "tmm" of the metal material 25 deposited on the source/drain regions 4 is smaller than the film thickness "tmr1" of the metal material 25 deposited on the source/drain regions 54, the film thickness "tm" of the cobalt silicide films 9 in the source/drain regions 4 is smaller than the film thickness "tr1" of the cobalt silicide films 59 in the source/drain regions 54.

Figure 7:
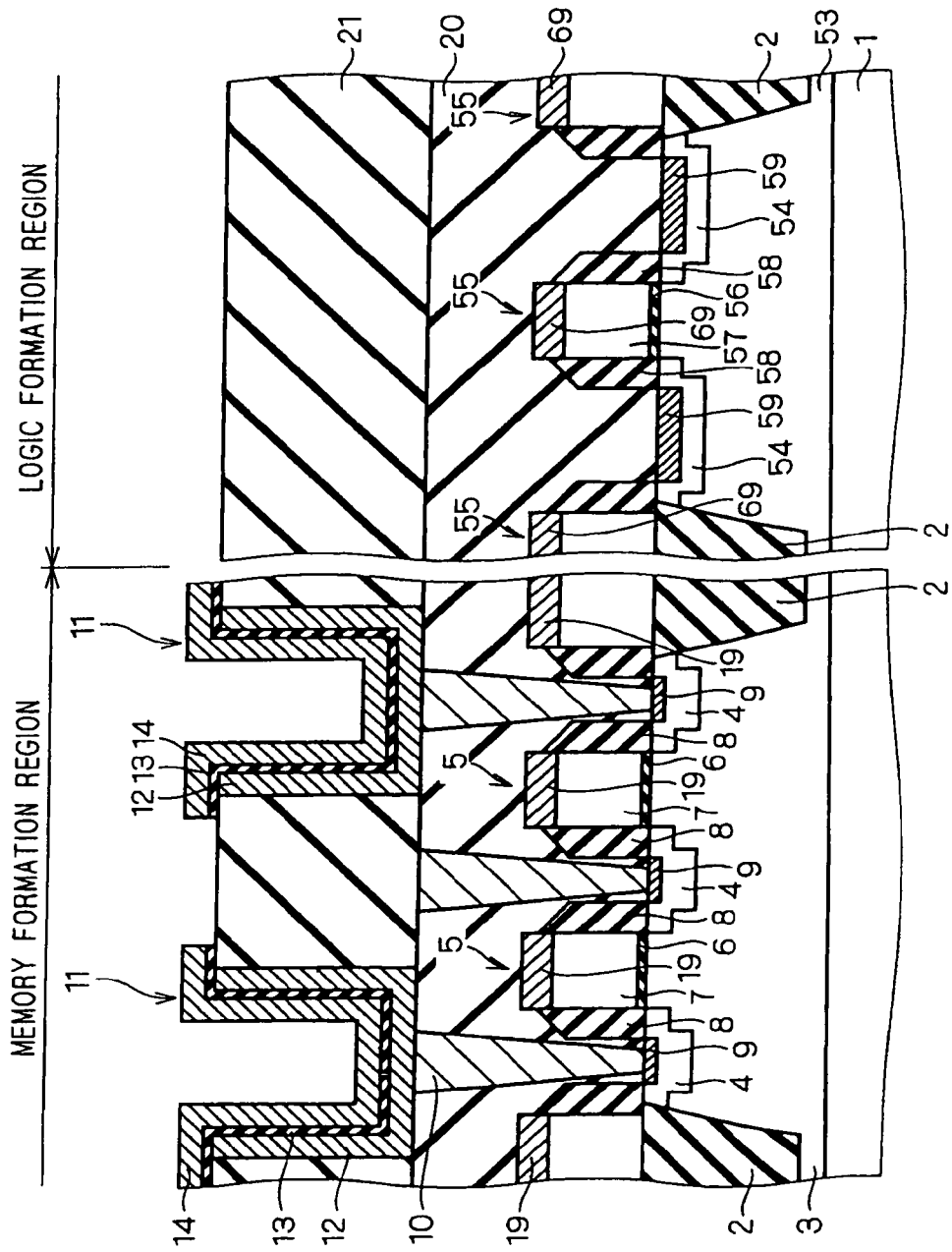

Next, as shown in FIG. 7, the interlayer insulating film 20 is formed over the semiconductor substrate 1 to cover the gate structures 5, 55 and cobalt silicide films 19, 69. Then contact plugs 10 are formed in the interlayer insulating film 20. Specifically, first, a resist having a given opening pattern (not shown) is formed on the interlayer insulating film 20. Next, the interlayer insulating film 20 is etched using this resist to form, in the interlayer insulating film 20, contact holes (not shown) that reach the cobalt silicide films 9. Then contact plugs are formed to fill the contact holes, whereby a plurality of contact plugs 10 are formed in the interlayer insulating film 20.

Next, interlayer insulating film 21 is formed on the interlayer insulating film 20 and contact plugs 10. Then openings (not shown) are formed in the interlayer insulating film 21 to expose the contact plugs 10 that are each electrically connected to one of adjacent source/drain regions 4.

Next, as shown in FIG. 7, DRAM memory cell capacitors 11 are formed in the openings, so that they are in contact with the exposed contact plugs 10. Specifically, first, a metal film containing a refractory metal, e.g. ruthenium, is formed all over the surface. Then, with the openings covered with resist, the metal film portion on the upper surface of the interlayer insulating film 21 is removed by anisotropic dry etching. Thus lower electrodes 12 of capacitors 11 that contain refractory metal, e.g. ruthenium, are formed in the openings. Next, an insulating film of, e.g. ditantalum pentoxide, and a metal film that contains a refractory metal, e.g. ruthenium, are stacked in this order all over the surface, which are then patterned using resist. Thus the dielectric films 13 of capacitors 11, that are made of ditantalum pentoxide, and the upper electrodes 14 of capacitors 11, that contain refractory metal, e.g. ruthenium, are formed, whereby the capacitors 11 are completed in the openings.

Next, interlayer insulating film 22 is formed all over the surface and planarized by CMP. The interlayer insulating film 22 covering the capacitors 11 is thus formed on the interlayer insulating film 21, whereby the insulating layer 23 is completed.

Next, contact holes (not shown) are formed through the insulating layer 23 to expose contact plugs 10 that are not electrically connected with capacitors 11, and contact holes (not shown) are formed through the insulating layer 23 and interlayer insulating film 20 to expose the cobalt silicide films 59 in the logic formation region. Then the contact holes are filled with contact plugs, so as to form contact plugs 15 through the insulating layer 23 and contact plugs 60 through the insulating layer 23 and interlayer insulating film 20.

Next, metal interconnection 16 in contact with the contact plugs 15 and metal interconnection 66 in contact with the contact plugs 60 are formed on the insulating layer 23.

The semiconductor device of FIG. 1 of the first preferred embodiment is thus completed through the process steps shown above.

In this way, in the first preferred embodiment, the first gate aspect ratio in the memory formation region is larger than the second gate aspect ratio in the logic formation region, so that the nondirectional sputtering method causes the metal material 25 to be deposited thinner on the source/drain regions 4 than on the source/drain regions 54. Therefore the cobalt silicide films 9 in the upper surfaces of the source/drain regions 4 are thinner than the cobalt silicide films 59 in the upper surfaces of the source/drain regions 54.

In other words, the cobalt silicide films 9 can be easily formed thinner than the cobalt silicide films 59 through the nondirectional sputtering method since the first gate aspect ratio is larger than the second gate aspect ratio.

Therefore the leakage current between the source/drain regions 4 and the well region 3 is lower than the leakage current between the source/drain regions 54 and the well region 53.

On the other hand, since the cobalt silicide films 59 are thicker than the cobalt silicide films 9, the resistance of the source/drain regions 54 is lower than that of the source/drain regions 4. It is thus possible to achieve both of lowered resistance of the source/drain regions 54 in the logic formation region and reduced leakage current of capacitors 11 electrically connected to the cobalt silicide films 9.

Furthermore, since the first gate aspect ratio is larger than 0.8 in the first preferred embodiment, it is easy to form thinner cobalt silicide films 9 in the memory formation region. This is now described.

FIG. 8 is a diagram showing the relation between the gate aspect ratio and silicide film thickness. In FIG. 8, the solid line shows a characteristic obtained when the nondirectional sputtering method is used to form silicide film and the one-dot-chain line shows a characteristic obtained when a sputtering method with good linearity is used. As shown in FIG. 8, when the gate aspect ratio exceeds 0.8, the silicide film thickness rapidly decreases at an increasing rate of variation. Therefore, the cobalt silicide films 9 can easily be formed thin by setting the first gate aspect ratio larger than 0.8 as explained in the first preferred embodiment.

Second Preferred Embodiment

Figure 9:
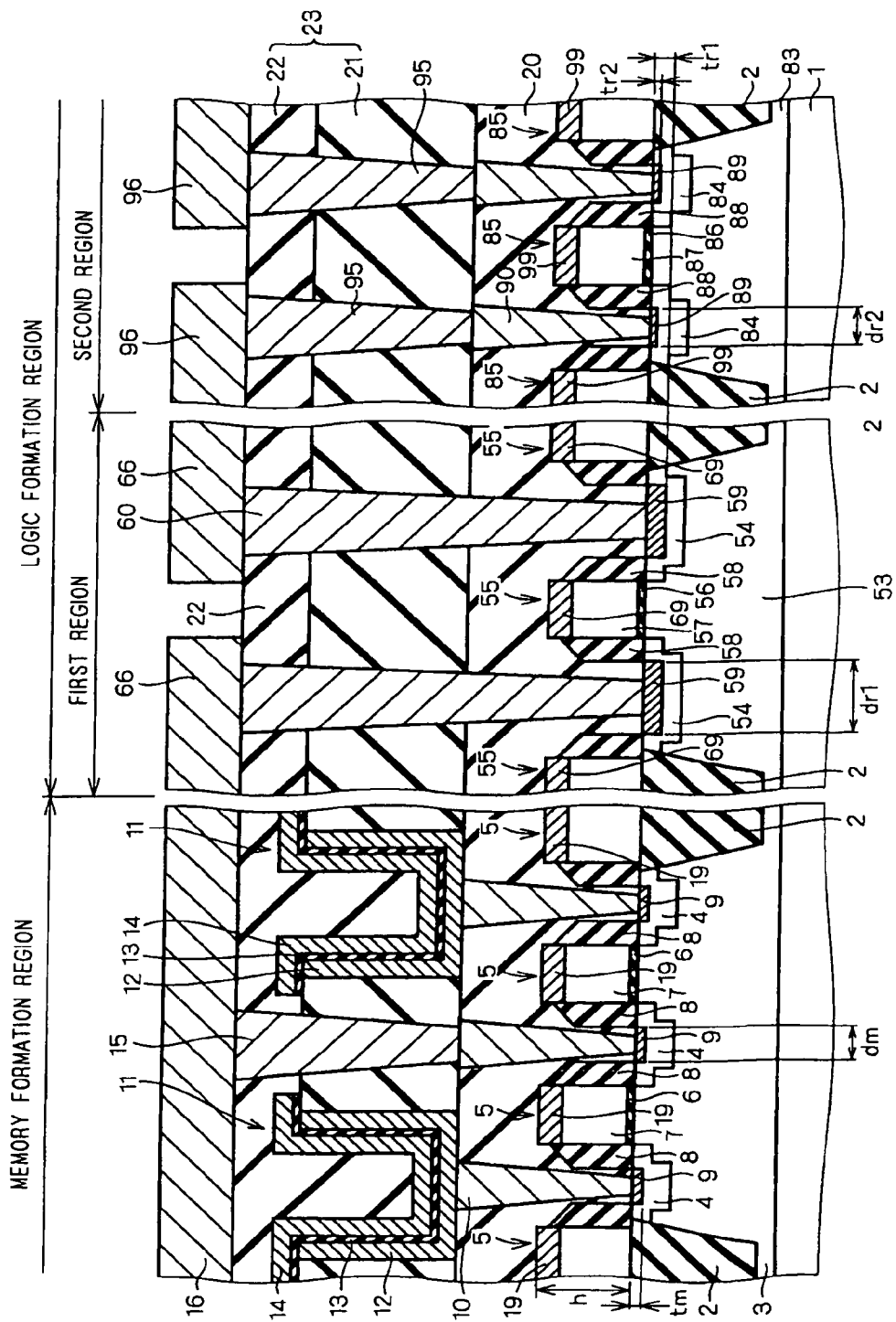
FIG. 9 is a cross-sectional view showing the structure of a semiconductor device according to a second preferred embodiment of the invention.

FIG. 9 is a cross-sectional view showing the structure of a semiconductor device according to a second preferred embodiment of the invention. According to the second preferred embodiment, basically, the semiconductor device as shown in the first preferred embodiment further includes, in the logic formation region, a region having a gate aspect ratio that is larger than the second gate aspect ratio. In the second preferred embodiment, the region having the second gate aspect ratio described in the first preferred embodiment is referred to as a "first region" and the region having a gate aspect ratio larger than the second gate aspect ratio, an additional region introduced in the second preferred embodiment, is referred to as a "second region."

As shown in FIG. 9, the semiconductor device of the second preferred embodiment has a well region 83, or a p-type impurity region, that is formed in the second region of the logic formation region in the upper surface of the semiconductor substrate 1. In the upper surface of the well region 83, a plurality of source/drain regions 84 are formed at given distances from each other and cobalt silicide films 89 are formed in their upper surfaces. The source/drain regions 84 are n-type impurity regions.

In the second region, a plurality of gate structures 85 are positioned at given distances on the semiconductor substrate 1. Each gate structure 85 is formed of a gate insulating film 86, a gate electrode 87, and sidewalls 88, with a cobalt silicide film 99 formed on top of the gate electrode 87. The gate insulating film 86, gate electrode 87 and cobalt silicide film 99 are stacked in this order on the semiconductor substrate 1, forming a stacked structure. The sidewalls 88 are formed on the sides of the stacked structure. Each gate structure 85 is located on the upper surface of the semiconductor substrate 1 between adjacent source/drain regions 84, with the cobalt silicide films 89 between adjacent gate structures 85.

A gate structure 85, a pair of adjacent source/drain regions 84, and the well region 83 form an MOS transistor serving as the logic device. The gate insulating films 86 are made of silicon oxide film and the gate electrodes 87 are made of polycrystalline silicon film, for example.

The cobalt silicide films 89 in the second region are thinner than the cobalt silicide films 59 in the first region. The height "h" of the gate structures 85 is equal to that of the gate structures 55, and the distance "dr2" between adjacent gate structures 85 is smaller than the distance "dr1" between gate structures 55. Therefore the gate aspect ratio in the second region, which is obtained by dividing the height "h" of the gate structures 85 by the distance "dr2" between gate structures 85, is larger than the second gate aspect ratio in the first region. The gate aspect ratio in the second region is hereinafter referred to as a "third gate aspect ratio."

In the second preferred embodiment, the first and third gate aspect ratios are set larger than 0.8 and the second gate aspect ratio is set equal to or less than 0.8.

The interlayer insulating film 20 over the semiconductor substrate 1 extends also in the second region, covering the gate structures 85 and cobalt silicide films 99. The insulating layer 23 on the interlayer insulating film 20 also extends in the second region.

In the second region, a plurality of contact plugs 90 are formed in and through the interlayer insulating film 20. The contact plugs 90 are connected to the cobalt silicide films 89 in the source/drain regions 84, with the upper surfaces of the contact plugs 90 exposed from the interlayer insulating film 20.

In the second region, a plurality of contact plugs 95 are formed in and through the insulating layer 23. The contact plugs 95 are connected to the underlying contact plugs 90, with the upper surfaces of the contact plugs 95 exposed from the insulating layer 23. On the insulating layer 23 in the second region, metal interconnection 96 lies in contact with the contact plugs 95.

Thus, in the second region, as in the memory formation region, a stacked structure is adopted to connect the upper-layer metal interconnection and the cobalt silicide films.

Thus, in the semiconductor device of the second preferred embodiment, the cobalt silicide films 89 are thinner than the cobalt silicide films 59, so that the leakage current between the source/drain regions 84 and the well region 83 is lower than the leakage current between the source/drain regions 54 and the well region 53. Therefore, in the logic device, circuitry whose leakage current should be reduced can be formed in the second region to certainly reduce the leakage current of that circuitry.

Also, since the cobalt silicide films 59 are thicker than the cobalt silicide films 89, the resistance of the source/drain regions 54 is lower than that of the source/drain regions 84. Therefore, by using the source/drain regions 54 to form circuitry whose operating speed is crucial, e.g. a circuit called "critical path" that determines speed performance of the logic device, it is possible to certainly allow that circuitry to operate at an enhanced speed, resulting in an enhanced operating speed of the entire logic device.

Also, the presence of the cobalt silicide films 59 and 89 respectively in the source/drain regions 54 and 84 enables high speed operation of the MOS transistors having the source/drain regions 54 and reduces the leakage current of the MOS transistors having the source/drain regions 84.

Figure 10:
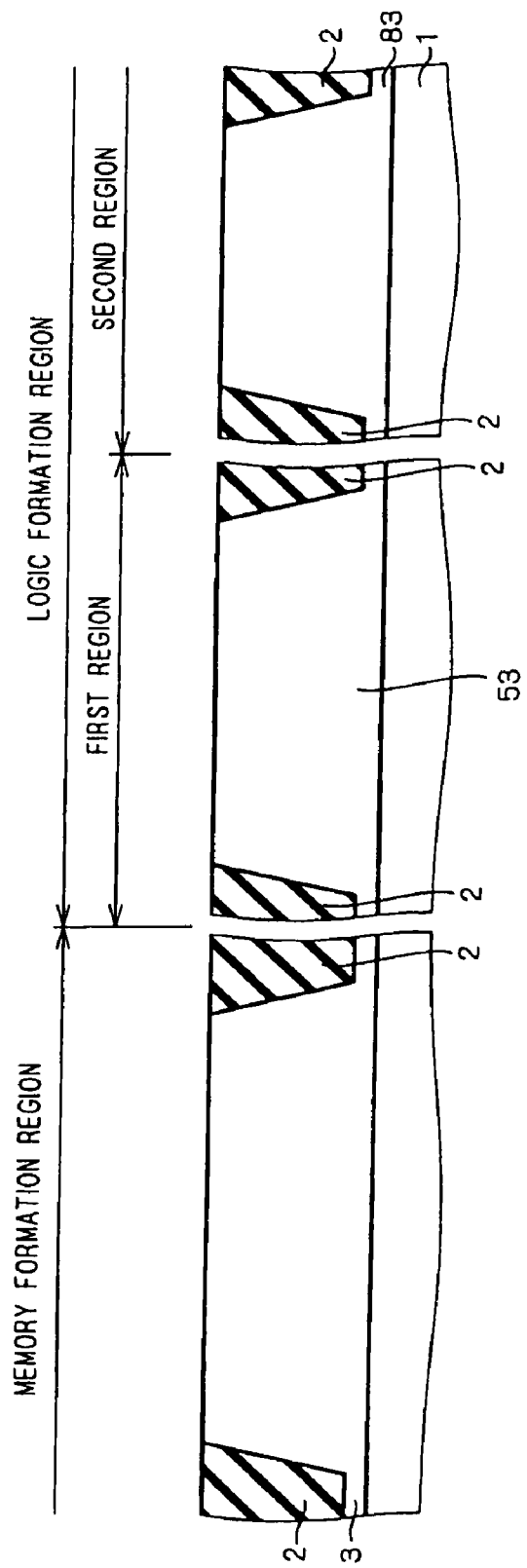
FIGS. 10 to 17 are cross-sectional views showing a sequence of process steps for manufacturing the semiconductor device of the second preferred embodiment of the invention.

Next, a method for manufacturing the semiconductor device of FIG. 9 is described. FIGS. 10 to 17 are cross-sectional views showing a sequence of process steps for manufacturing the semiconductor device of FIG. 9. First, as shown in FIG. 10, element isolation insulating films 2 are formed in the upper surface of the semiconductor substrate 1 and then the well regions 3 and 53, and the well region 83 in the second region of the logic formation region, are formed in the upper surface of the semiconductor substrate 1.

Figure 11:
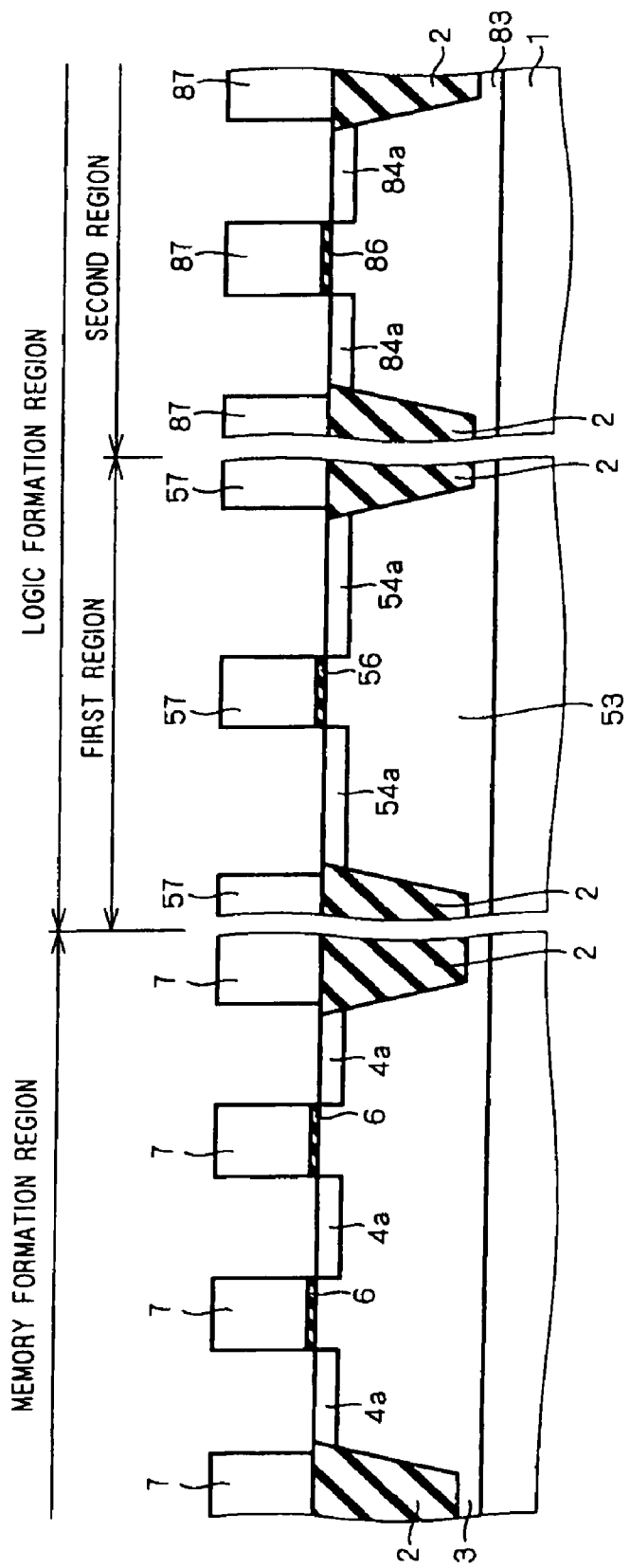

Next, by thermally oxidizing the semiconductor substrate 1, for example, a silicon oxide film is formed on the upper surface of the semiconductor substrate 1 and then a polycrystalline silicon film is formed all over the surface. Then, the silicon oxide film and polycrystalline silicon film are etched using a resist having a given opening pattern. As shown in FIG. 11, this forms the gate insulating films 6, 56 and gate electrodes 7, 57, and also forms the gate insulating films 86 and gate electrodes 87 in the second region.

Next, using as masks the element isolation insulating films 2, gate insulating films 6, 56, 86 and gate electrodes 7, 57, 87, an impurity, e.g. phosphorus or arsenic, is ion-implanted at a relatively low concentration into the upper surface of the semiconductor substrate 1. As shown in FIG. 11, this forms the impurity regions 4a and 54a, and also forms n$^-$-type impurity regions 84a in the upper surface of the semiconductor substrate 1 in the second region.

Next, a silicon nitride film is formed all over the surface by, e.g. CVD, and then etched by an anisotropic dry etching process presenting a high etch rate in the depth direction of the semiconductor substrate 1. This forms, as shown in FIG. 12, the sidewalls 8 and 58, and also forms the sidewalls 88 of silicon nitride film, whereby the gate structures 5, 55, 85 are completed on the semiconductor substrate 1.

Next, using the gate structures 5, 55, 85 and the element isolation insulating films 2 as masks, an impurity, e.g. phosphorus or arsenic, is ion-implanted into the upper surface of the semiconductor substrate 1 at a relatively high concentration. This forms, as shown in FIG. 12, the impurity regions 4b, 54b, and also forms $n^+$-type impurity regions 84b in the second region in the upper surface of the semiconductor substrate 1.

Figure 12:
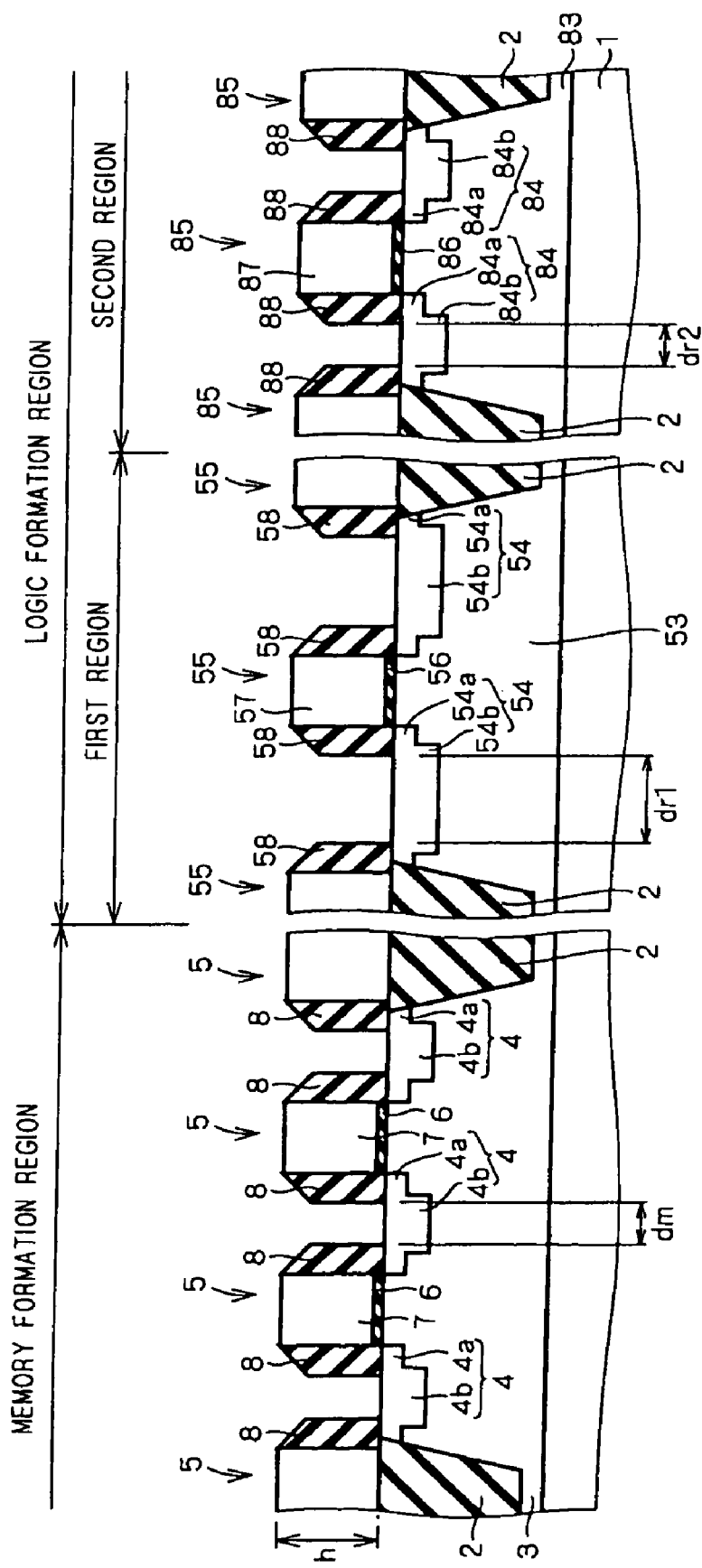

Through the process steps described referring to FIGS. 11 and 12, a plurality of gate structures 85 are formed in the second region of the semiconductor substrate 1, and source/drain regions 84, including impurity regions 84a, 84b, are formed in the upper surface of the well region 83 between adjacent gate structures 85, whereby MOS transistors serving as the logic device are completed.

Figure 13:
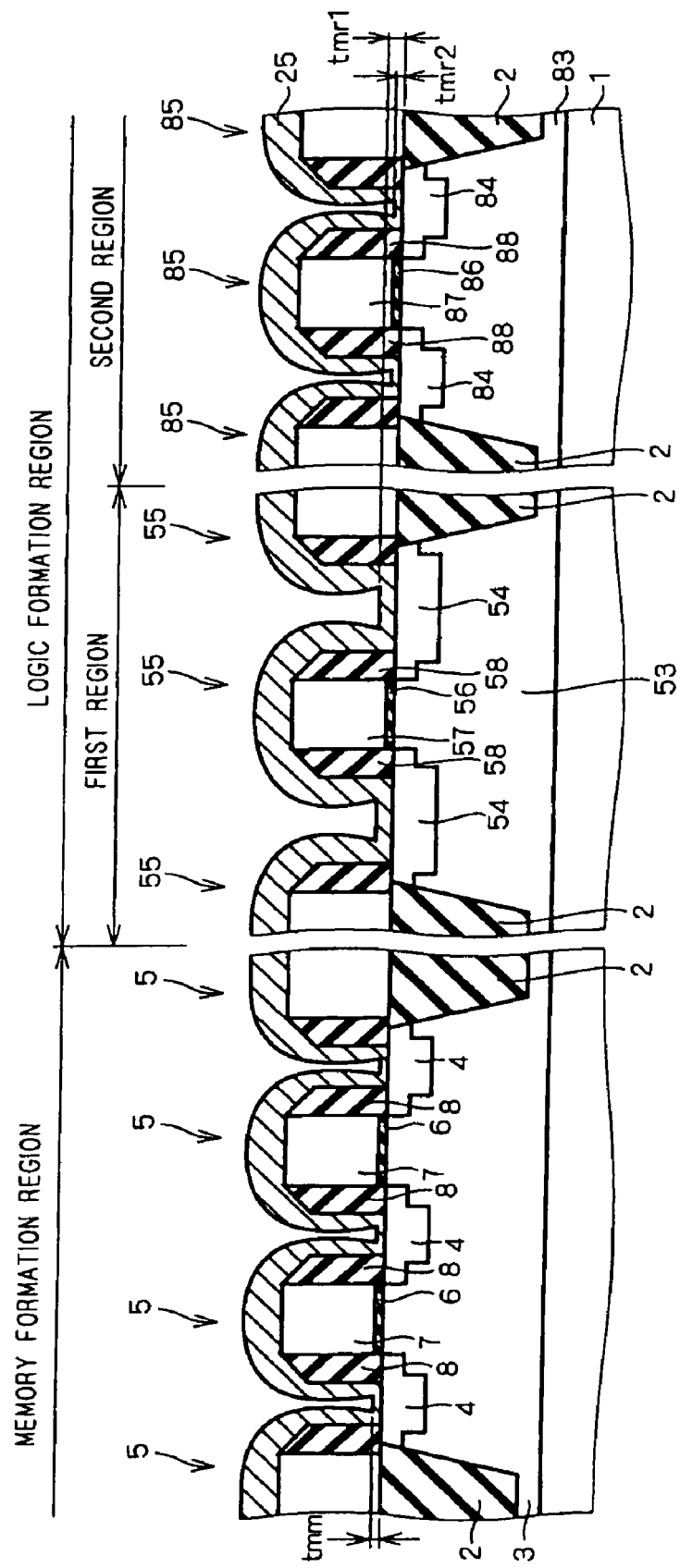

Next, as shown in FIG. 13, a nondirectional sputtering process is applied from above the structure of FIG. 12 to deposit metal material 25 of cobalt all over the surface. As previously described, when metal material 25 is deposited by the nondirectional sputtering method, a larger gate aspect ratio causes the metal material to be deposited to a smaller film thickness on the source/drain regions. In the second preferred embodiment, the second gate aspect ratio is smaller than the first and third gate aspect ratios, so that, as shown in FIG. 13, the thickness "tmr1" of the metal material 25 on the source/drain regions 54 is larger than the thickness "tmm" of the metal material 25 on the source/drain regions 4 and the thickness "tmr2" of the metal material 25 on the source/drain regions 84.

Next, a thermal process with a lamp annealing apparatus, for example, is performed to cause the metal material 25 and the silicon in contact with it to react with each other. That is, a reaction is caused between the metal material 25 and the semiconductor substrate 1 and gate electrodes 7, 57, 87 that are in contact with it. Then unreacted portion of metal material 25 is removed.

Figure 14:
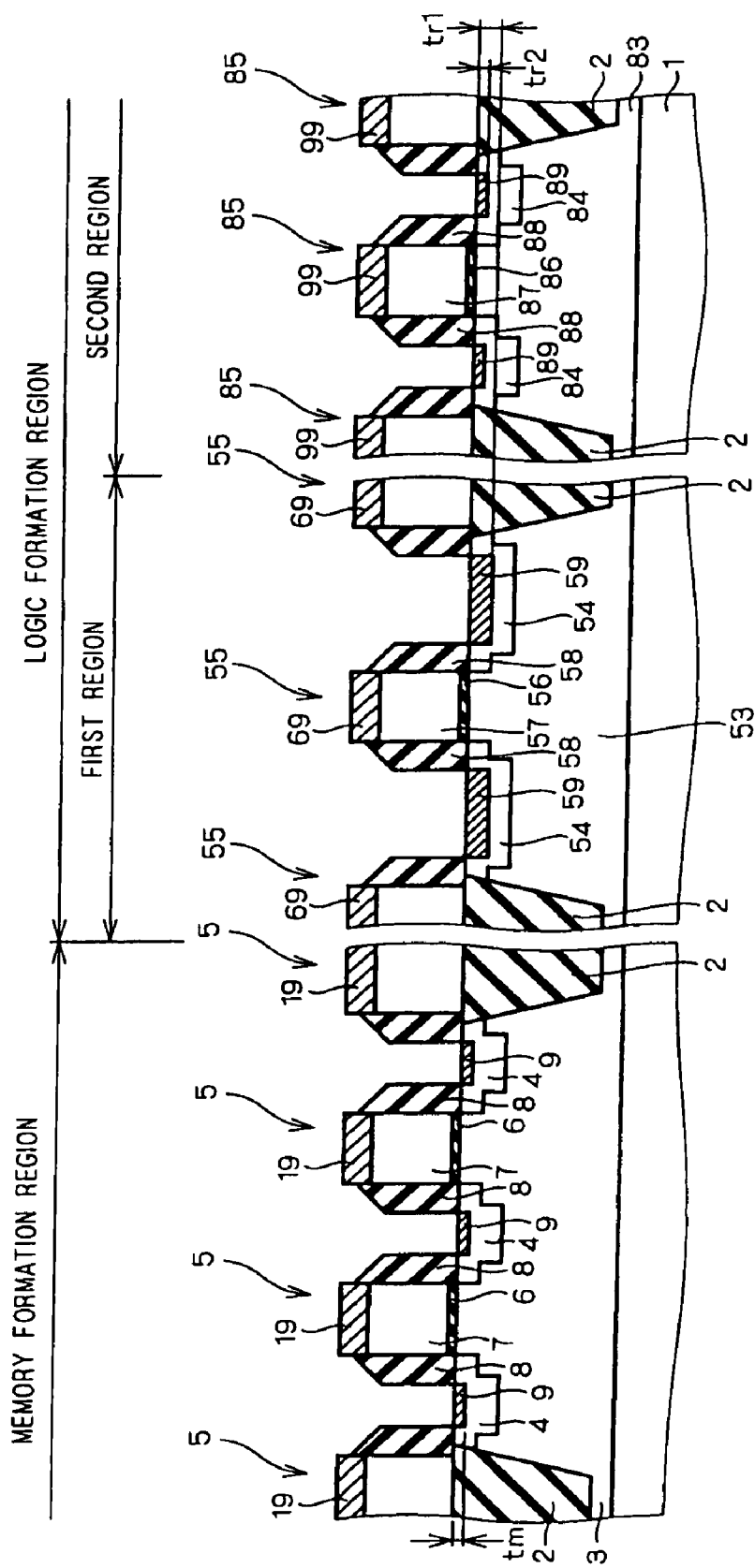

Thus, as shown in FIG. 14, the upper surface of the semiconductor substrate 1 is partially silicidized to form cobalt silicide films 9 and 59, and to form cobalt silicide films 89 in the upper surfaces of the source/drain regions 84. At the same time, the top surfaces of the gate electrodes 7, 57, 87 are silicidized to form cobalt silicide films 19 and 69, and also to form cobalt silicide films 99 on the gate electrodes 87.

At this point, the film thickness "tmr1" of the metal material 25 deposited on the source/drain regions 54 is larger than the film thickness "tmm" of the metal material 25 deposited on the source/drain regions 4 and the film thickness "tmr2" of the metal material 25 deposited on the source/drain regions 84, so that the film thickness "tr1" of the cobalt silicide films 59 in the source/drain regions 54 is larger than the film thickness "tm" of the cobalt silicide films 9 in the source/drain regions 4 and the film thickness "tr2" of the cobalt silicide films 89 in the source/drain regions 84.

Figure 15:
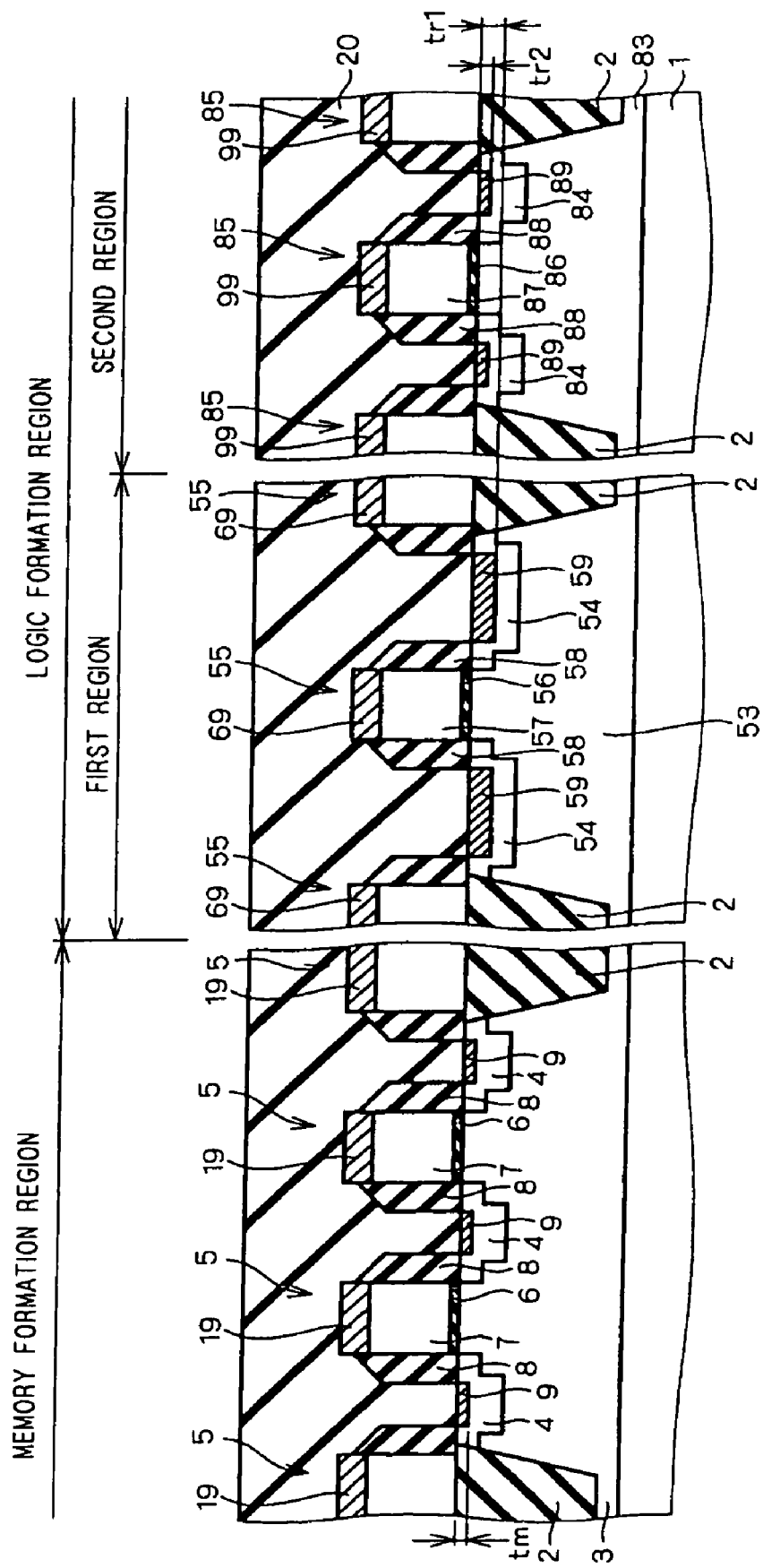
Figure 16:
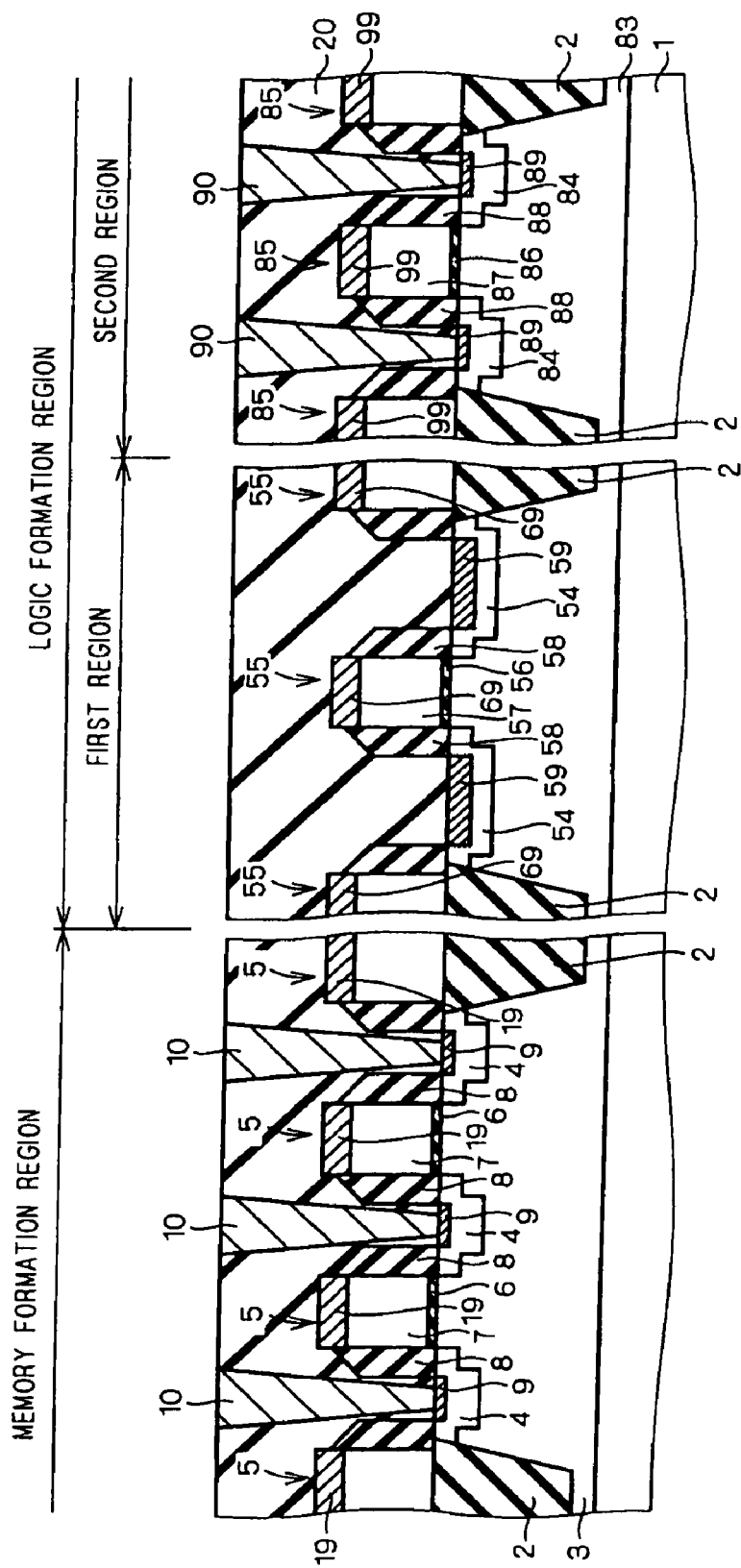

Next, as shown in FIG. 15, the interlayer insulating film 20 is formed over the semiconductor substrate 1 to cover the gate structures 5, 55, 85 and cobalt silicide films 19, 69, 99. Then, as shown in FIG. 16, contact plugs 10 and 90 are formed in the interlayer insulating film 20. Specifically, first, a resist having a given opening pattern (not shown) is formed on the interlayer insulating film 20. Next, the interlayer insulating film 20 is etched using this resist to form, in the interlayer insulating film 20, contact holes (not shown) that reach the cobalt silicide films 9 and contact holes (not shown) that reach the cobalt silicide films 89. Then contact plugs are formed to fill the contact holes, whereby contact plugs 10 and 90 are formed in the interlayer insulating film 20.

Figure 17:
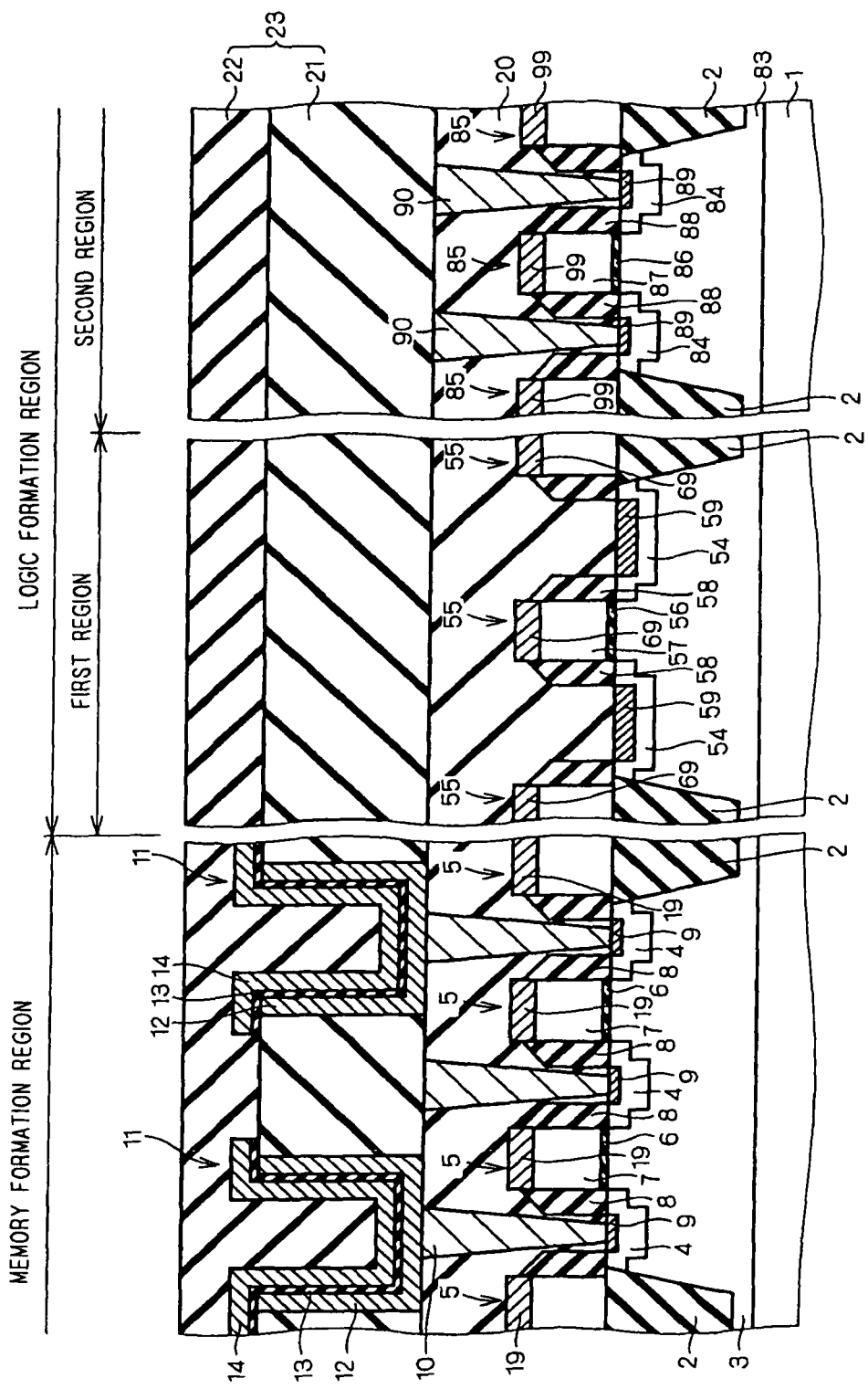

Next, as shown in FIG. 17, the interlayer insulating film 21 is formed over the interlayer insulating film 20 and contact plugs 10 and 90, and DRAM memory cell capacitors 11 are formed in the interlayer insulating film 21 in the above-described manner. Next, interlayer insulating film 22 is formed all over the surface and planarized by CMP. Thus the insulating layer 23 is formed on the interlayer insulating film 20 and the capacitors 11 are formed in the insulating layer 23.

Next, in the insulating layer 23, contact holes (not shown) are formed to expose contact plugs 10 that are not electrically connected with capacitors 11; also, contact holes (not shown) are formed to expose the contact plugs 90. Further, contact holes (not shown) for exposing cobalt silicide films 59 in the first region are formed through the insulating layer 23 and interlayer insulating film 20. Then the contact holes are filled with contact plugs, completing the contact plugs 15, 60, and the contact plugs 95 in the second region in the insulating layer 23.

Next, the metal interconnections 16 and 66, and the metal interconnection 96 in contact with the contact plugs 95, are formed on the insulating layer 23. The semiconductor device of FIG. 9 of the second preferred embodiment is thus completed.

In this way, in the second preferred embodiment, the third gate aspect ratio in the second region is larger than the second gate aspect ratio in the first region, so that the cobalt silicide films 89 in the second region form thinner than the cobalt silicide films 59 in the first region.

In other words, the cobalt silicide films 89 can be easily formed thinner than the cobalt silicide films 59 by nondirectional sputtering method because the third gate aspect ratio is larger than the second gate aspect ratio. Thus, the leakage current between the source/drain regions 84 and well region 83 is lower than the leakage current between the source/drain regions 54 and well region 53. Therefore, logic device circuitry whose leakage current should be reduced can be formed in the second region to certainly reduce the leakage current of that circuitry.

On the other hand, since the cobalt silicide films 59 are thicker than the cobalt silicide films 89, the resistance of the source/drain regions 54 is lower than that of the source/drain regions 84. Therefore, circuitry whose operating speed is crucial can be fabricated using the source/drain regions 54 so as to ensure its enhanced operating speed, resulting in an enhanced operating speed of the entire logic device.

Furthermore, in the second preferred embodiment, since the first and third gate aspect ratios are both set larger than 0.8, the cobalt silicide films 9 in the memory formation region and the cobalt silicide films 89 in the second region can both be formed thinner easily for the reason described earlier.

When, unlike in the second preferred embodiment, the upper-layer metal interconnection 96 is connected to the cobalt silicide films 89 each through a single contact plug as in the first region (and hence a plurality of such contact plugs are formed), then, as the distance "dr2" between the gate structures 85 becomes smaller, it becomes difficult, because of process-technological restrictions, to certainly connect the upper-layer metal interconnection 96 and the cobalt silicide films 89 while maintaining insulation between adjacent contact plugs.

In the second preferred embodiment where the second region adopts a stacked structure, the diameters of the contact plugs 90 and 95 can be smaller than when the upper-layer metal interconnection 96 is connected to the cobalt silicide films 89 each through a single contact plug. Therefore, when a plurality of pairs of contact plugs 90 and 95 are formed as shown in the second preferred embodiment, it is possible to certainly connect the upper-layer metal interconnection 96 and the cobalt silicide films 89 while maintaining insulation between adjacent contact plug pairs, even when the distance "dr2" between gate structures 85 is set small to suppress the leakage current.

While the invention has been described in detail, the foregoing description is in all aspects illustrative and not restrictive. It is understood that numerous other modifications and variations can be devised without departing from the scope of the invention.

The invention claimed is:

1. A semiconductor device comprising:
a semiconductor substrate having a logic formation region where a logic device is formed;
a first impurity region formed in an upper surface of said semiconductor substrate in said logic formation region;
first and second gate structures formed on said upper surface of said semiconductor substrate in said first impurity region and spaced apart at a first distance from each other;
a second impurity region formed in an upper surface of said semiconductor substrate in said logic formation region and having a conductivity type same as that of said first impurity region;
third and fourth gate structures formed on said upper surface of said semiconductor substrate in said second impurity region and spaced apart at a second distance from each other;
a third impurity region formed in an upper surface of said first impurity region between said first and second gate structures and having a conductivity type different from that of said second impurity region;
a fourth impurity region formed in an upper surface of said second impurity region between said third and fourth gate structures and having a conductivity type different from that of said second impurity region;
a first silicide film formed in an upper surface of said third impurity region; and
a second silicide film formed in an upper surface of said fourth impurity region and having a larger thickness than said first silicide film;
wherein said first and second silicide films are formed between first and second gate structures and between said third and fourth gate structures respectively, and
a first gate aspect ratio defined by the first distance and a height of said first and second gate structures is larger than a second gate aspect ratio defined by the second distance and a height of said third and fourth gate structures.

2. The semiconductor device manufacturing method according to claim 1, further comprising:
an interlayer insulating film formed over said semiconductor substrate and covering said first to fourth gate structures; and
first and second contact plugs formed in and through said interlayer insulating film and connected to said first and second silicide film respectively.

3. The semiconductor device according to claim 1, wherein said first gate aspect ratio is larger than 0.8 and said second gate aspect ratio is equal to or less than 0.8.

4. The semiconductor device according to claim 1, wherein said third and fourth impurity regions are a source or drain region of a MIS transistor.

5. The semiconductor device according to claim 2, further comprising:
an insulating layer provided on said interlayer insulating film; and
said second contact plug provided in and through said insulating layer connected to said first contact plug.

* * * * *